(12) United States Patent
Aingaran et al.

(10) Patent No.: US 6,507,935 B1
(45) Date of Patent: Jan. 14, 2003

(54) METHOD OF ANALYZING CROSSTALK IN A DIGITAL LOGIC INTEGRATED CIRCUIT

(75) Inventors: Kathirgamar Aingaran, Mountain View, CA (US); Chin-Man Kim, Sunnyvale, CA (US); Hong You, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/513,161

(22) Filed: Feb. 25, 2000

(51) Int. Cl.[7] .............................. G06F 17/50
(52) U.S. Cl. .................. 716/5; 716/2; 716/3; 716/4; 716/12; 716/19
(58) Field of Search ............... 716/2, 4, 5, 6, 716/12, 19

(56) References Cited

U.S. PATENT DOCUMENTS 6,327,542 B1 * 12/2001 McBride ..................... 716/5
6,370,674 B1 * 4/2002 Thill ........................... 716/4
6,378,109 B1 * 4/2002 Young et al. ................ 716/2

* cited by examiner

Primary Examiner—Matthew Smith
Assistant Examiner—Thuan Do
(74) Attorney, Agent, or Firm—Gunnison, McKay & Hodgson, L.L.P.; Philip J. McKay

(57) ABSTRACT

An automated method of analyzing crosstalk in a digital logic integrated circuit on a digital computer is described. The method uses available software to make an extracted, parameterized netlist from a layout of the integrated circuit. The netlist has gate and black box invocations as well as transistor invocations. Library models are used to find driving resistances and capacitances associated with the gate and black-box invocations. For at least one potential victim wire of the plurality of wires, a subset of the wires of the chip are found to be potential aggressor wires to the victim wire. The aggressor wires are combined into a common aggressor. A risetime of the common aggressor is calculated and used to calculate the magnitude of coupled noise on the victim wire induced by the aggressor wires. An alarm threshold for each potential victim wire is determined based upon the type of logic gate that receives the victim wire. The alarm thresholds for each potential victim wire are compared to the calculated height of a coupled noise on the victim wire to determine which, if any, wires of the design suffer enough crosstalk noise that they should be redesigned.

9 Claims, 6 Drawing Sheets

METHOD OF ANALYZING CROSSTALK IN A DIGITAL LOGIC INTEGRATED CIRCUIT

CROSS REFERENCE TO RELATED PATENT APPLICATIONS

The present invention is related to the subject matter disclosed in U.S. patent application Ser. No. 09/513,545 filed on even date herewith and assigned to Sun Microsystems, Inc., assignee of the present invention, the disclosure of which is herein specifically incorporated by this reference.

BACKGROUND OF THE INVENTION

The present invention relates, to the field of noise analysis models for use in designing digital integrated circuits ("ICs"). More particularly, the present invention relates to a hierarchical use of a two pole time-gated model of coupling noise of particular utility in analyzing submicron integrated circuit designs to detect or prevent problems due to noise voltages from coupling between various circuit components.

A major factor in the design of high speed digital circuits is the inevitable parasitic resistances and capacitances that degrade circuit performance. It is known that accurate modeling of digital circuit performance requires that parasitic resistances and capacitances be considered. Software is available from vendors including Cadence Design Systems and Avant!, for extracting the total capacitance, including parasitic capacitances, on nodes of an integrated circuit and for estimating the effect of this capacitance on circuit speed.

Parasitic resistances, capacitances, and inductances are also known to couple noise onto individual nodes of an integrated circuit by coupling signals between adjacent circuit elements. The undesired coupling of signals between adjacent elements is known as crosstalk.

Although digital circuits are inherently resistant to noise, the scaling of supply voltages and metal oxide semiconductor field effect transistor ("MOSFET") threshold voltages has resulted in modern submicron designs having lower noise margins than typical of earlier designs. Most complementary metal oxide semiconductor ("CMOS") circuits continue to have considerable immunity to power supply and substrate noise even at the submicron level. However, the effect of capacitive coupling noise has become a major concern for designers of deep sub-micron circuits.

A good noise detection tool must not only pick out the noise problems on chip, but also be useable on large datasets such as those of ten to twenty million or more transistor integrated circuit designs. Since noise on any given digital circuit is either a problem or it is not, the exact amount of noise induced is not of as great a concern to the digital designer, as it is to know whether the induced noise crosses a threshold of potential failure for that net.

The scaling of transistor sizes in digital integrated circuits has also led to the shrinking of wire dimensions. A proportionate scaling of the wire thickness would result in an increasing of wire resistance. To avoid this resistance increase, the scale factor for the wire thickness has usually been much smaller than the scale factor for horizontal dimensions including wire to wire spacing. Further, the space between wires is also reduced by the scaling factor. Hence, the coupling capacitance per unit length between minimally-spaced adjacent nodes is greater on modern submicron processes than it is with earlier CMOS digital integrated circuit processes.

Interconnect layers in modern multilayer-metal integrated circuits tend to be designed such that wires on a given layer of metal are generally routed orthogonal to those on an adjacent layer. This orthogonality results in many relatively small parasitic capacitances to circuit elements on the adjacent layers, the noise contribution of these is minimal because the contributions of many of these small capacitances tend to cancel each other.

All these factors contribute to a relative increase per unit length in capacitance to neighboring wires and a decrease in the capacitance to the relatively quiet planes above and below the wire. This leads to an increase in the coupling coefficient of a given wire to adjacent wires. In addition, the reduction of the vertical wire dimension, albeit smaller than the scaling factor, and the shrinking of the horizontal wire dimension according to the scale factor, result in an increase in wire resistance that also aggravates the noise situation.

The increased coupling coefficients and wire resistances contribute to much larger noise voltages being induced in deep sub-micron designs than seen in previous generations. These voltages can push digital gates into the amplifying region of their transfer characteristic, turning traditionally noise rejecting gates into noise amplifying stages. Induced noise voltages can create several different problems on chip. Of these, designers are most concerned with the detection of faulty logic transitions triggered by noise, especially irrevocable logic transitions, such as the firing of a precharged dynamic gate or corruption of data in a storage element.

Noise voltages and spikes cannot be easily measured on silicon since probing a given net greatly alters its coupling coefficient because of the immense capacitance of the probe. It is far preferable that parasitic and noise effects be evaluated through pre-tapeout simulation rather than through debugging after wafer fabrication.

Noise problems typically are a function of the data set, the testing frequency and process variations. Large test vector sets are needed to increase the probability that the chip reaches a condition where the effect of coupling noise can be seen during simulation.

A good noise detection methodology can and must ensure that a large and complex chip, such as a modern microprocessor, can be produced and tested without significant delay or cost being added in the noise detection steps.

A. Noise Effects on Chip

Noise on any given net in the chip can have one or more of the following effects:

Data loss or metastability in latches, flip-flops or other storage elements. This can result from a noise spike on a clock, reset, set, or latch enable input; or from a noise spike on a data input coincident with a clock transition.

Faulty logic transitions, including transitions in dynamic logic gates. Dynamic logic gates may be viewed as a combination of logic and storage elements.

Speed changes leading to setup or hold time violations due to the Miller effect, when the aggressor (the line(s) that induce noise in neighboring lines) and the victim (the line that has noise induced in it) switch in opposite directions.

Substrate bounce due to current injection into the substrate, when voltage excursions due to noise are above or below the supply level.

Extra power dissipation due to propagated glitches.

It is essential to prevent data loss in latches and flip-flops, and faulty logic transitions in dynamic logic, lest functionality be compromised. The effects on power are typically less significant, while speed changes can be accounted for by guardbanding standard timing tools and by designing the underlying circuits accordingly. The most crucial requirement of a noise detection tool is that it prevent data loss or corruption in storage elements and data corruption due to faulty logic transitions.

The problem of incorrect data stored in storage elements can be subdivided into two categories, frequency dependent noise (wherein a change of clock frequency causes the noise pulse to occur outside the sampling period of the storage element and therefore work correctly at a different frequency) and frequency independent noise (wherein a change of frequency does not shift the noise pulse relative to the sampling period and the error occurs at many frequencies).

B. Requirements of a Noise Detection Strategy

To guarantee function, a noise detection strategy should ensure that all frequency independent noise problems are detected such that they may be eliminated and the chip can be guaranteed to work at some frequency.

A tighter criteria is that the strategy should guarantee the chip will work at the target frequency and all lower frequencies. Whatever tool is used should detect both frequency independent and frequency dependent noise problems that may cause functional failure at the target frequency.

A third, stricter, criteria that may be applied in a conservative design, is to prevent all faulty logic transitions induced by coupled noise.

For it to be possible to verify large devices of the order of a million transistors or more, it is necessary that circuit modeling be done with a tool faster and less memory intensive than those which construct full-circuit matrix equations, as does the well known circuit simulator SPICE.

A noise detection tool should also allow for sensitivity analysis on the circuit parameters. This enables designers to run what-if analysis on suspect wires during design and redesign. For example, analysis may be repeated for a process minimum and a process maximum of metal line-to-line or layer-to-layer spacing, or for a typical versus a minimum enhancement device threshold.

It is also desirable that errors in a coupling-noise detection tool be on the side of pessimism than on the side of optimism. While pessimistic analysis may result in some degree of extra labor in design of an integrated circuit, the resulting design can be guaranteed to work whereas an optimistic analysis may result in undetected problems remaining in a design.

SUMMARY OF THE INVENTION

A high capacity noise analysis tool is created for analyzing potential noise coupling in submicron integrated circuit designs. This tool uses a two-pole model of coupling. This tool is a software product operational on a digital computer permitting it to analyze large numbers of aggressor and victim wires.

The tool's speed of analysis is enhanced by combining multiple aggressors into single aggressors for analysis, and by performing a hierarchical analysis.

The aforementioned and other features and objects of the present invention and the manner of attaining them will become more apparent and the invention itself will be best understood by reference to the following description of a preferred embodiment in conjunction with the accompanying drawings, wherein:

DESCRIPTION OF A PREFERRED EMBODIMENT

Figure 1A:
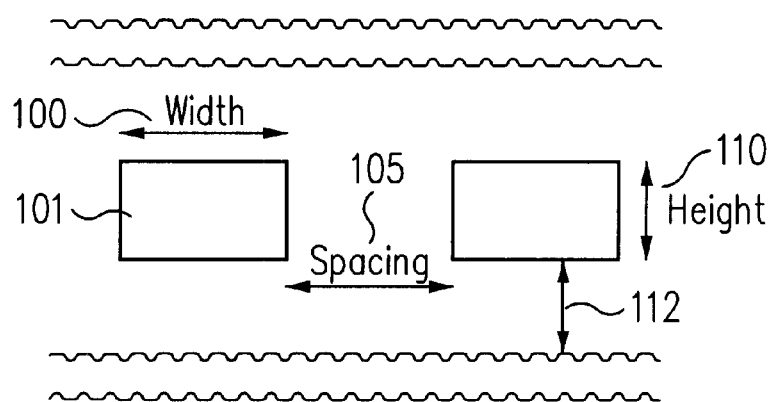
FIG. 1a is a sectional illustration of the relative dimensions of minimum width metal lines, or wires, on previous generations of CMOS processes.
Figure 1B:
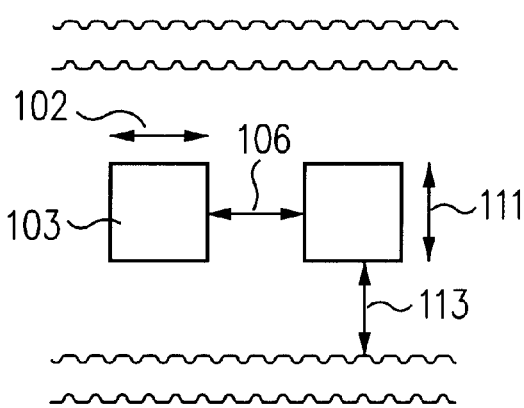
FIG. 1b, an illustration of the relative dimensions of minimum width metal lines, or wires, on current generation CMOS processes.

Reduction of typical feature dimensions to the submicron range has resulted in the aspect ratio of the wires being changed as shown from that of FIG. 1a to that of FIG. 1b after scaling. Typically, the width 100 of a metal line 101 (FIG. 1a) at the micron level of process is shrunk by a scale factor to a narrower width 102 for a metal line 103 (FIG. 1b1) when fabricated on a deep submicron process. Similarly, the line spacing 105 (FIG. 1a) is shrunk by the scale factor to a narrower line spacing 106 (FIG. 1b), while the line thickness or height 110 (FIG. 1a) stays substantially constant 106 (FIG. 1b). The dielectric thickness also remains substantially similar between micron 112 (FIG. 1a) and submicron 113 (FIG. 1b) processes.

Figure 2A:
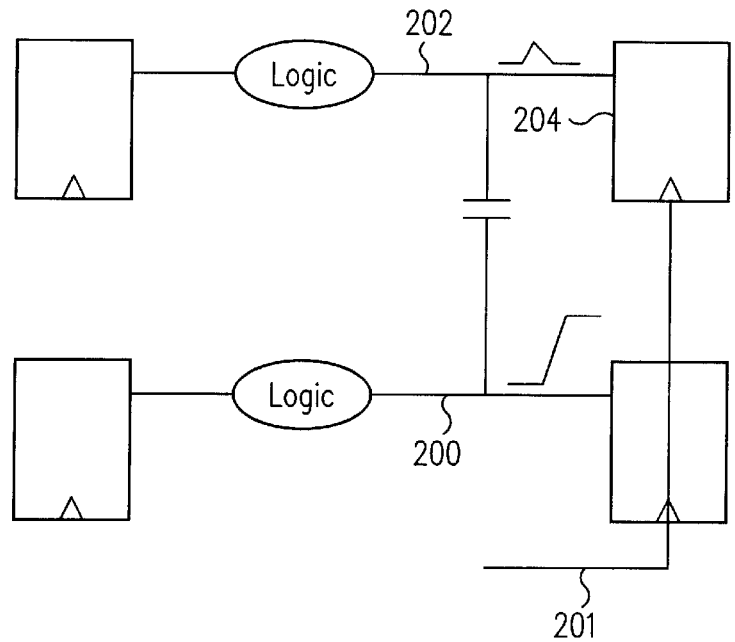
FIG. 2a, a circuit diagram illustrating how a frequency dependent coupled noise can disrupt data in a data storage element.

Consider the flip flop in FIG. 2A, where coupling noise is injected from a neighboring line to the flip-flop input. Assuming the aggressor signal 200 (FIG. 2), changes just before the rising edge of the clock, 201, the noise pulse on the victim line 202, then ccurs during the setup period of flip-flop, 204. This results in an incorrect value being stored in 204. However, if the frequency is lowered, the signal 200 arrives early relative to clock 201, and the noise pulse on the victim line 202 then occurs earlier than, and ends before, the setup or sampling period of the flip-flop 204. This is frequency dependent noise, since any failure vanishes at lower frequency.

Figure 2B:
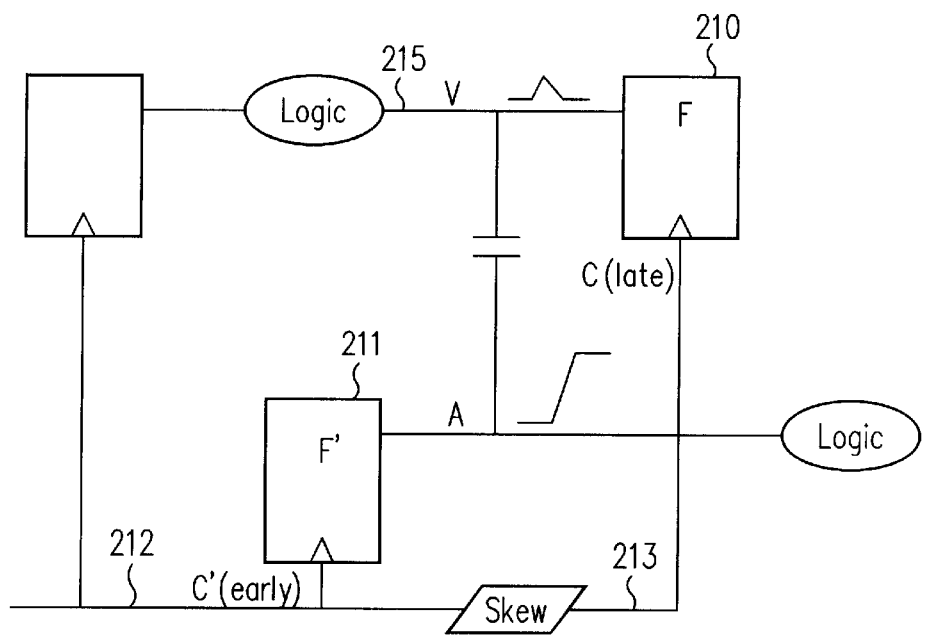
FIG. 2b, a circuit diagram illustrating how a frequency independent coupled noise can disrupt data in a data storage element.

If we consider the flip-flop 210 in FIG. 2b, the noise pulse is now caused by coupling with the output of another flip-flop 211 which we assume gets an early (skewed) clock, 212 relative to the clock at flip-flop 210. At least some degree of clock skew is inevitable on modern submicron digital integrated circuits. It is now possible that the noise pulse caused by aggressor 211 on victim line 215 occurs during the sampling or setup period of flip-flop 210. Since the aggressor 211 moves with the rising clock edge, no matter how much the frequency is reduced, the noise pulse most likely remains during the sampling period of flip-flop 200 and so results in an incorrect value being stored in flip-flop 200. This is frequency independent noise-induced data corruption, since it does not change with the frequency.

Noise on dynamic gates that results in the firing of the victim gate (loss of precharged voltage on the gate) is most often frequency independent noise, since dynamic gates cannot recover from a wrong transition regardless of the operating frequency. Dynamic logic is commonly used even at the submicron level in design of on-chip memory circuits, among other places.

To simplify analysis, it has been found possible to guarantee that noise does not propagate through amplifying stages by setting a low threshold for tolerable noise on a net. This makes noise on each net a function of its neighbors and itself, independent of noise from earlier logic stages. While pessimistic, this approach guarantees function.

Circuit Model

Figure 3:
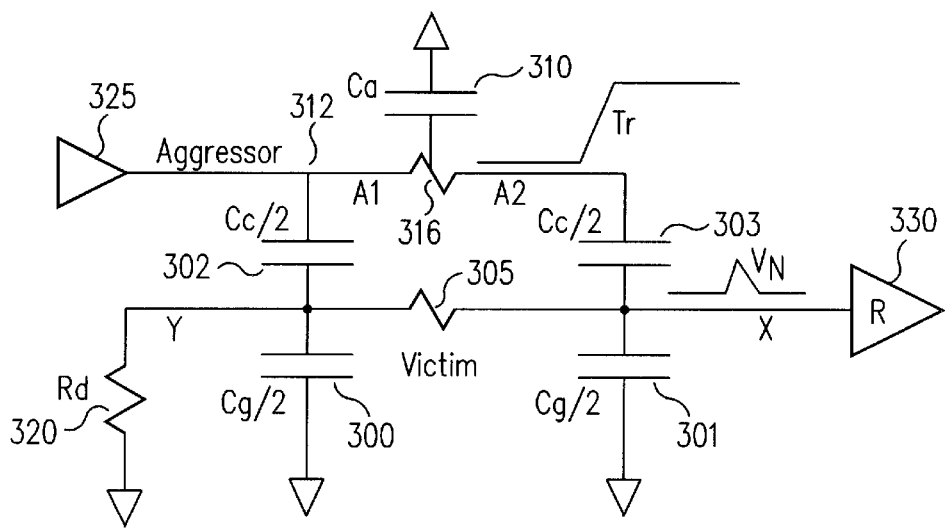
FIG. 3, a circuit diagram of a model that is used to model coupling noise between circuit elements in the noise analysis tool of the present invention.

In the interest of high analysis speed a simplified circuit model as shown in FIG. 3, is used to model the crosstalk. Referring to FIG. 3, we model the victim line as a single pi segment resistance/capacitance ("RC") circuit. Capacitances to effective ground 300 and 301, and coupling capacitances 302 and 303, are lumped at the beginning and end of the victim line resistance 305. An inherent assumption of this model is that the coupling capacitance and ground capacitance are uniformly distributed throughout the wire. The victim line is assumed to hold its value by way of a transistor or group of transistors in the linear region of operation, modeled as a single equivalent resistor 320; representing the ON resistance of the transistors, the value of which may be determined from the device geometries and circuit configuration.

For the aggressor, A, the model assumes a ramp with a fixed slope, Vdd/Tr, that is rising or falling from time O to time Tr. The rise time, Tr, is estimated from the circuit parameters, including the equivalent resistance of the transistors and ground capacitances 310, on the aggressor side 312 of the coupling capacitances. Since this is a simple 2-pole circuit, it can be solved to give the voltage at X, $$Vx(t) = Pe_1^{k_1 t} + Qe_2^{k_2 t} + \frac{Cc \cdot \left(Rd + \frac{Rw}{2}\right)}{Tr}, \quad \text{Equation 1}$$

$$0 \leq t \leq Tr \quad \text{and}$$

$$Vx(t) = \left(Pe_1^{k_1 Tr} + Qe_2^{k_2 Tr} + \frac{Cc \cdot \left(Rd + \frac{Rw}{2}\right)}{Tr}\right) \cdot e^{\frac{-(t-Tr)}{(Rd + \frac{Rw}{2}) \cdot Ct}},$$

$$t > Tr$$

Where k1, and k2 are the natural frequencies of the circuit and P and Q are given by $$P = \frac{Cc \cdot (1 + k_2 RCt)}{Tr \cdot Ct \cdot (k_1 - k_2)}, \quad Q = -\left(\frac{Cc \cdot (1 + k_1 RCt)}{Tr \cdot Ct \cdot (k_1 - k_2)}\right)$$

with R=Rd+Rw/2 and Ct=Cg+Cc. The natural frequencies K1 and K2 can be found as:

$$k1 = \left(\frac{-1}{C_i}\right)\left[\frac{2}{R_w} + \frac{1}{R_d} + \sqrt{\left(\frac{4}{R_w^2} + \frac{1}{R_d^2}\right)}\right]$$

$$k2 = \left(\frac{-1}{C_i}\right)\left[\frac{2}{R_w} + \frac{1}{R_d} - \sqrt{\left(\frac{4}{R_w^2} + \frac{1}{R_d^2}\right)}\right]$$

with R=Rd+Rw/2 and Ct=Cc. All numbers are normalized to the supply voltage, Vdd. A simplified single-pole model represents decay of the pulse, for time greater than Tr, without much loss of accuracy.

Rise time of the aggressor lines is estimated from the switching ON resistance of the devices 325 driving those lines, the total capacitive load (sum of the coupling capacitors 302 and 303, and all other capacitances 310 on the line) and a portion of the wire resistance 316 of those lines. The risetime is taken as the geometric mean of the risetime at the source and destination ends of the wire.

$$Tr = \frac{2}{\left(\frac{1}{Trise(SourceEnd)} + \frac{2}{Trise(DestinationEnd)}\right)}$$

Typical circuits have multiple aggressor lines per victim line. By superposition the stimulus for N aggressors is:

$$\sum_{i=1}^{N} \frac{Cc(i)}{Tr(i)}$$

This is equivalent to a lumped aggressor with all capacitance connected to it and risetime Tr (equiv):

$$\frac{\sum_{i=1}^{N} Cc(i)}{Tr(eqv)} \sum_{i=1}^{N} \frac{Cc(i)}{Tr(i)} \quad \text{which gives}$$

$$Tr(eqv) = \left(\sum_{i=1}^{N} \frac{Cc(i)}{Tr(i)}\right)^{-1} \times \sum_{i=1}^{N} Cc(i).$$

Multiple aggressors are lumped together in the model, with an effective rise time for the lumped line. This effective rise time, Tr(eff), is the weighted harmonic mean of the individual rise times of all the aggressors, attacking the victim line and is given by $$Tr(eff) = \left(\sum_{i=1}^{N} \frac{Cc(i)}{Tr(i)}\right)^{-1} \times \sum_{i=1}^{N} Cc(i) \quad \text{Equation 3}$$

Where the weighting factor Cc(i) is the capacitive coupling from the ith aggressor to the victim and N is the total number of aggressors.

Figure 4:
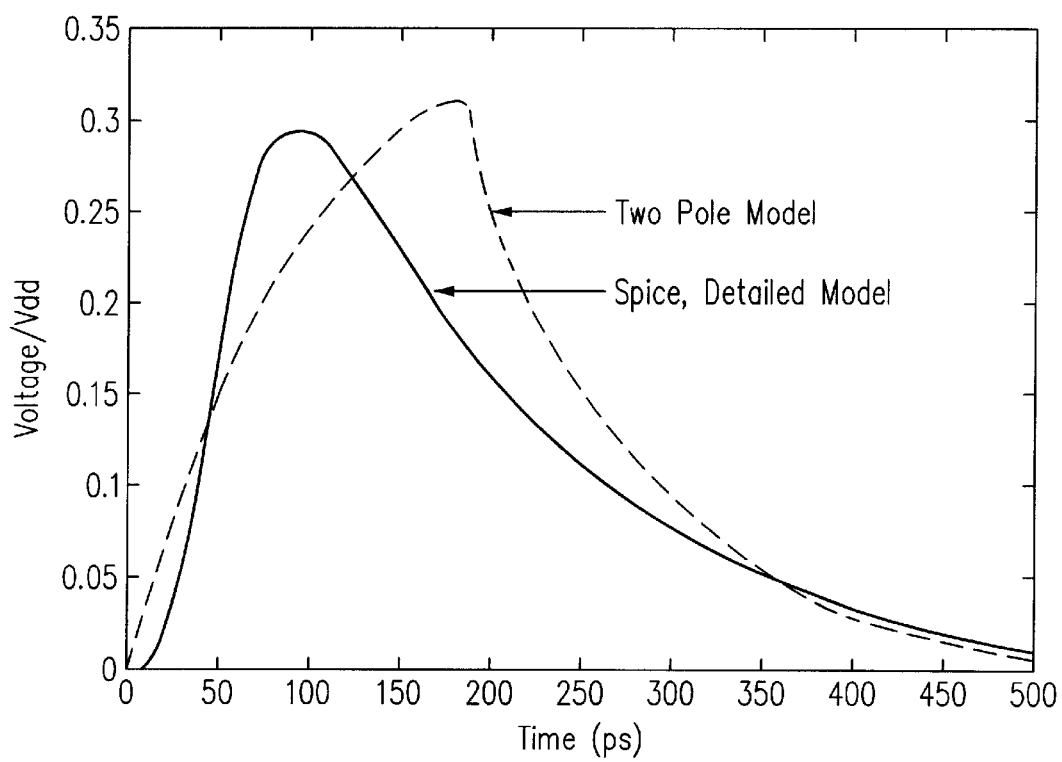
FIG. 4, a comparison of a coupling noise waveform produced by the two pole model of the present invention and a SPICE simulation of coupling using a more detailed model.

FIG. 4 shows a plot of a noise waveform produced by SPICE for a realistic circuit model and the approximation of this noise pulse as given by the above equation.

Failure Criteria of Noise Pulses

The criteria for failure depends not only on the noise pulse but also on the gate that receives this pulse as an input. The criteria ensures that the amount of noise propagated through the receiving gate is below a given level, with margin for ground bounce and other effects. For any given gate, there exist two values, the maximum noise energy $E_{NMAX}$, and maximum peak noise voltage $V_{NMAX}$, which the gate can tolerate without propagating noise through it. It has been found that an acceptable pass criteria is:

$$\text{Max}\{Vx(t)\} < V_{NMAX} \quad \text{Equation 4}$$

and $$\text{Max}\{Vx(t)\} < V_{NMAX} \quad \text{Equation 4}$$

and $$\int_{T_n} V_x(t)^2 \, dt < E_{NMAX} \qquad \text{Equation 5}$$

$$\int_{tn} V_x(t)^2 dt < E_{NMAX} \qquad \text{Equation 5}$$

Where Tn is the duration of the noise pulse.

'Propagating noise through a gate' may be defined in two ways. Amplified propagation corresponds to noise propagating through a gate being greater than the input noise to the gate. Restricting the input noise pulse to be small enough that the receiving gate is not pushed into the greater than unity gain region of operation eliminates amplified propagation. For most symmetric static gates, this corresponds to setting $V_{NMAX}$ equal to or less than the unity gain voltage in the dynamic transfer characteristic of the receiving gate.

For dynamic gates, where the gain in one direction is much higher than in the other direction, discharge current is a function of the square of the gate voltage. The amount of charge discharged by a MOSFET in the evaluate stack due to a noise pulse is proportional to the energy of the pulse to first order. Bounding this energy to a low value, $E_{NMAX}$, ensures a lack of amplified propagation. Bounding the peak voltage to a particularly low value also ensures absence of propagation through the dynamic gate. Alternatively, a reduced $V_{NMAX}$ is defined for dynamic gates that prevents propagation of noise and avoids need for Equation 5, but this induces some pessimism.

Pulse propagation, or propagation of noise through a gate, for the preferred embodiment is assumed to occur where the input noise to a gate causes a pulse at the output having a height greater than 5% of the rail. By limiting $E_{NMAX}$ and $V_{NMAX}$ to limits that are determined by circuit simulation for each gate type, pulse propagation is eliminated.

Eliminating pulse propagation prevents amplified propagation for all practical gates. As an alternate to simulation, $E_{NMAX}$ and $V_{NMAX}$ can be calculated from the transistor models, gate structure and loading information. These limits are fairly uniform across families of gates, therefore typical values for $E_{NMAX}$ and $V_{NMAX}$ are determined for classes of gates. Then finding the $V_{NMAX}$ or $E_{NMAX}$ failure threshold requires identifying the class of gates for a wire destination and looking up and applying the correct predetermined pass criteria. The preferred embodiment utilizes a gate-name based classifier that classifies gates into six gate types: static gates, dynamic gates, Flip-flop logic inputs, flip-flop clock inputs, pass gate structures, and unclassifiable gates.

For wires having multiple loads of different types, the smallest $V_{NMAX}$ value of the relevant gate types is selected as the failure threshold.

Exclusivity

The assumption that all aggressors of a given line fire at the same time and in the same direction is inherent in the lumping of all aggressors into a single aggressor. This leads to undue pessimism in the analysis in several cases. In a given set of aggressors, there may be some logically exclusive signals that cannot switch in the same direction at the same time. There may be several signals that switch at different points of the cycle and it is pessimistic to assume they switch simultaneously.

The logical exclusivity of signals may be provided by the user, as with some available timing tools. This is used to find the worst aggressor in any given mutually exclusive set. The worst of these aggressors is then lumped with other non-exclusive aggressors, to produced an effective lumped aggressor. Other signals in the mutually exclusive set are assumed quiet, and not contributing to the coupling.

Figure 5:
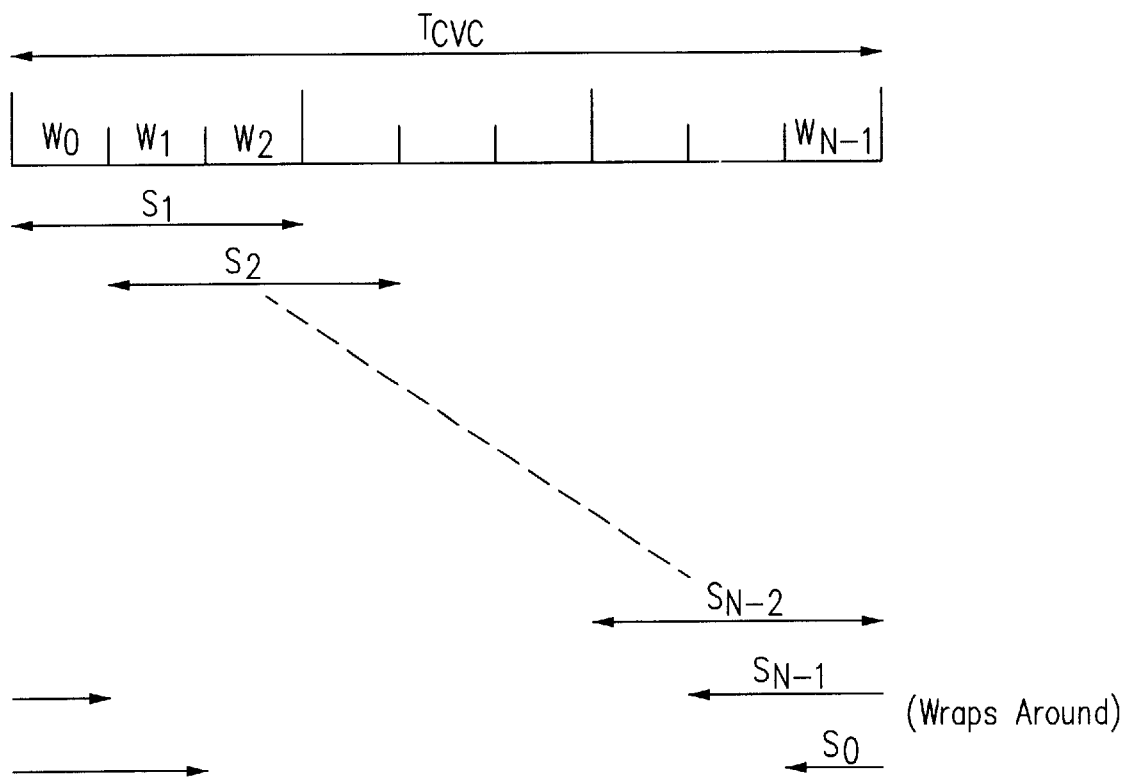
FIG. 5, an illustration of the event timing windows used by the preferred embodiment to account for non-simultaneous coupling-noise sources.

Temporal exclusivity is accounted for by defining timing windows in which signals can switch. As shown in FIG. 5, the cycle time is divided into N timing windows, labeled $W_0$ through $W_{N-1}$. Based on an a priori timing analysis, a signal is placed in the one or more windows in which it switches. Once all signals have been placed, we define a switching interval S, comprising three windows [$W_{(r-1)modN}$ Wr $W_{(r+1)modN}$] as shown in FIG. 5. This creates a set of overlapped switching intervals, $S_0$ through $S_{N-1}$. Noise analysis is done in each switching interval individually. The switching interval has the effect of spreading the signal switching time to the two neighboring windows. Any noise caused by a signal that switches in $W_r$ adds on to the effect of another signal that may switch $W_r$, $W_{r-1}$ or $W_{r+1}$. Spreading of the signal switching time accounts for the fact that signals are 'switching' not only when they are at the 50% of Vdd point, but from 0% to 100%. Spreading also allows for uncertainties in timing and clock skew. Consequently an ideal size for the switching intervals $S_0$ through $S_{N-1}$ is $$T_{interval} = T_{rise} + T_{skew} + T_{uncertainty} \qquad \text{Equation 6}$$

where $T_{rise}$=expected rise/fall time on the aggressors, $T_{skew}$= clock skew and $T_{uncertainty}$=uncertainty in signal arrival time.

The switching intervals wrap around, viz. a signal in $W_{N-1}$ spreads to $W_0$ and vice versa. Signals for which no timing information is available are placed in all the switching intervals while a few mostly-inactive signals (such as reset, and scan-enable) are placed in none. Once all signals are placed, noise analysis is done for each switching interval, using only those signals which may switch in that interval as aggressors. The noise in the worst case interval is reported as the noise on the line.

The number of windows used, N, is determined by $T_{interval}$ defined in equation (6). Since the skew and rise/fall times do not vary much, the uncertainty term usually determines the size of the interval used. A large N, leads to less pessimism in the noise analysis while a smaller N is more tolerant of uncertainties in the timing analysis. N must be at least 4, for this scheme to be meaningful, since a value of N=3 means the entire cycle is the switching interval. In practice N=6 to N=8 are achieved easily, whereas a tighter partition on the switching times may not be possible. With N=6, noise levels reported on a test datapath were about 30% less than without any timing information being taken into account.

Noisetool

An analysis tool (Noisetool) was developed to detect large coupling noise voltages induced in a microprocessor or other logic integrated circuit. It ensures that noise pulses do not propagate through an amplifying stage. Pulse propagation is eliminated, so that the noise induced on any net is induced only by its aggressive neighbors and not by the previous logic stages. This simplifies analysis by making noise on any net independent of nets in previous logic stages.

Figure 6:
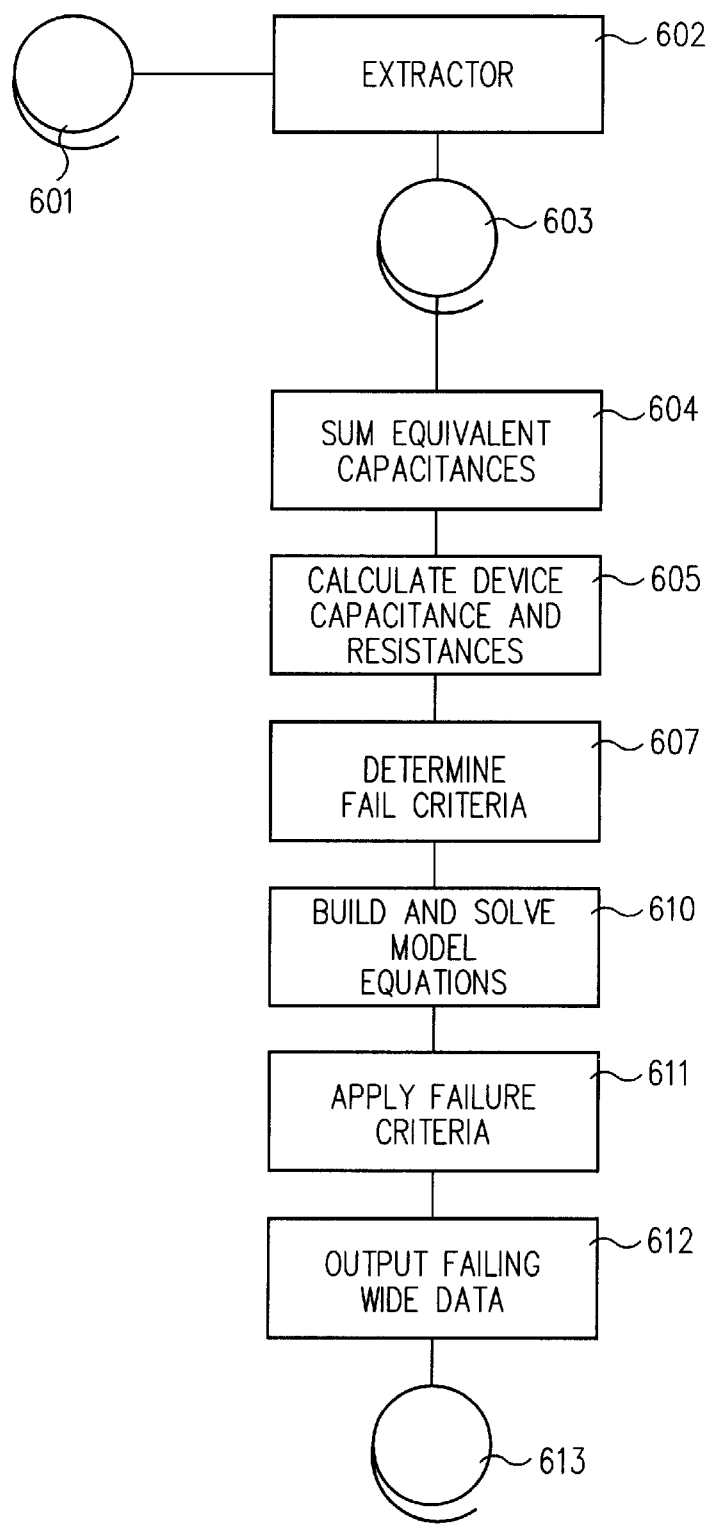
FIG. 6, a flow chart of the noise analysis process.

Noisetool uses a layout 601 parasitic extracted netlist 603, such as one extracted with the STAR extractor available from Avant! or other extractors known in the art 602. Interconnect parasitic capacitances are read from this netlist, while multiple capacitances to the same node or to equivalent quiet nodes are summed 604. These parasitic capacitances include the capacitances of capacitors 300, 301, 302, 303 and 310 of FIG. 3. The tool performs flat and hierarchical analyses as described. In flat analysis, gate and diffusion capacitance of the transistors are calculated 605 (FIG. 6) based on the transistor models and the transistor sizing information in the netlist. Since a bias independent linear resistance is assumed for the transistor holding the victim line (320 in FIG. 3), this resistance is computed based on the device parameters. During hierarchical analysis, capacitive loading and/or drive resistance of the sub-circuit ports are obtained from characterized data files.

Destination gates 330 described in the netlist are analyzed to determine their type, and pre-characterized values of $V_{NMAX}$ and $E_{NMAX}$ are found 607 that prevent pulse propagation for each possible victim wire.

Next, the circuit model shown in FIG. 3 is built 610 and solved through application of equations (1) and (2) above. The $V_{NMAX}$ and $E_{NMAX}$ failure criteria are applied 611 for each net. Failing nets are flagged and reported 612 in a result file 613 as violations with the calculated maximum noise voltage and other information about the net. Detailed circuit simulation in SPICE showed that the failure criterion of equation (4), tracks with failures observed in simulations.

It is preferable that a layout-versus-schematic analysis program be run prior to extraction of the netlist so that the netlist will have meaningful names, these names are placed in the result file 613 to assist review by design engineers.

Hierarchical Analysis

Figure 8:
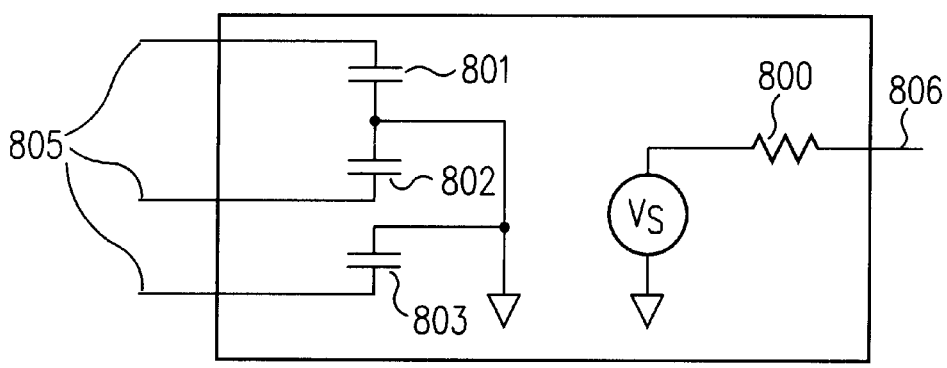
FIG. 8, a schematic diagram of a library model of a gate for use with a hierarchical gate-level netlist.

The analysis may be conducted on a flat parameterized, transistor level netlist of the circuit. Such analysis is often unwieldy for large designs due to the size of the netlists involved and run times for generating and analyzing them. It has been found that in the circuit model of FIG. 3, the driver element 320 need not be a transistor. It may be a gate or other block, as in the gate level block model illustrated in FIG. 8, with driving element resistance 800 connects to an output pin 806. Since characteristic switching resistances are generally found during timing characterization for all gates used in the design, Rd can be derived for any gate from available characterization data. Similarly, for the receiving gate inputs, such as input pins 805, capacitive loading information, modeled as capacitors 801, 802, and 803, can be obtained from characterized libraries.

Figure 7:
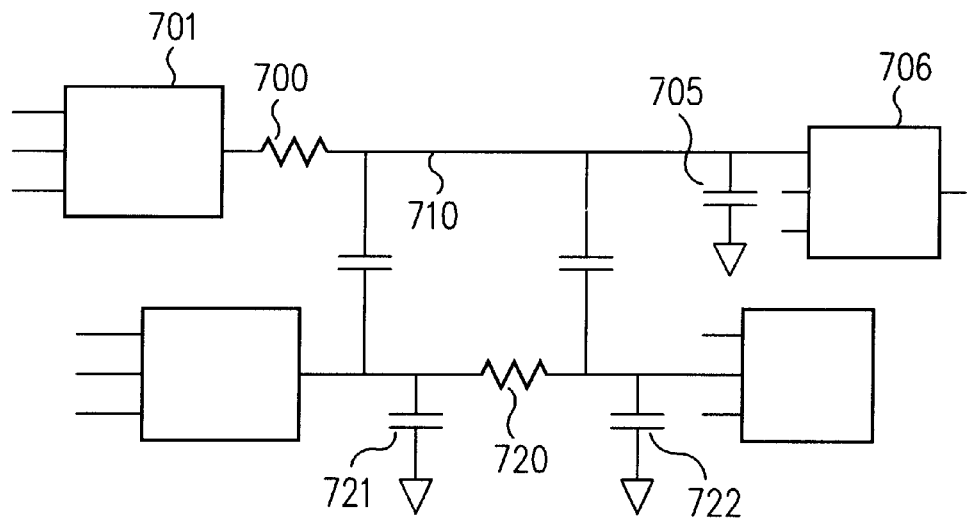
FIG. 7, a schematic diagram of the two-pole noise model applied to a hierarchical netlist.

When a hierarchical layout is extracted to a parameterized netlist, aggressor wire interconnect resistance is modeled as a resistor 700 (FIG. 7), in series with the appropriate output resistance from the gate block model effectively inserted into the netlist as the aggressor gate 701. The aggressor node parasitic capacitances are modeled as a capacitor 705 in parallel with the input capacitance of any load gates 706, such as library model input capacitance 801 (FIG. 8) on the aggressor wire. These resistances and capacitances are used to determine an aggressor wire 710 (FIG. 7) risetime.

Similarly, the output resistance from the appropriate gate model, such as library model output resistance 800, is used as the driving resistance 320 (FIG. 3) holding the victim line in the model. The victim line interconnect resistance 720 (FIG. 7) becomes the second pole resistance 305 (FIG. 3) of the model, and half of the interconnect capacitance of the victim line, illustrated by capacitors 725 and 726 of FIG. 7, become the victim line capacitances 300 and 301 (FIG. 3) of the model. The library gate model also incorporates tolerable input noise thresholds for use as $V_{NMAX}$ or $E_{NMAX}$.

The wire resistance used for non-reconvergent paths is computed by dropping all branch paths other than a shortest actual interconnect path between the driving gate and the destination gate. This may be pessimistic in the event that there are multiple paths from the driving gate 320 to the destination gate 330.

Other parameters needed for the analysis are obtained from a hierarchical layout extracted netlist, such as is obtained by extracting an integrated circuit layout with commercially available tools, with gates treated as a 'black box' with a characteristic output resistance and input capacitance as described. A hierarchical noise analysis may be conducted at an inter-gate level instead of a flat inter-transistor level. Abstracting the circuits even further, we can 'black box' entire blocks (such as datapaths, memories and control blocks) and run the extraction and noise analysis on a top level chip or high level block, using a default capacitance, output resistance, and thresholds for each pin of the block. Since the internal nodes of the black boxes are not visible to the hierarchical analysis, they are dealt with by a transistor or gate level analysis on the block itself. Such a hierarchical approach allows noise analysis to be done on arbitrarily large blocks by splitting them into manageable levels of hierarchy.

A hierarchical analysis at a very coarse level results in some inaccuracy because noise injected into a higher level of hierarchy from a lower level may be ignored. Smart extraction tools that do a 'gray box' extraction, where wiring from inside the hierarchy boxes is also extracted, can help reduce this inaccuracy. A lower level affected by routing in a higher level can be accounted for by a 'cookie cutter' extraction, where the top level routing is captured on top of a lower level block when the lower level block is extracted. If such tools are not available, keeping the level of the hierarchy box as low as possible reduces inaccuracy, while making the boxes bigger reduces complexity and run time. Table-3 compares the noise levels as measured by a gate level hierarchical analysis and flat analysis. It shows that the loss of accuracy in going from fully flat to gate level is small.

A hierarchical analysis may also be done prior to fully completing chip design. A top level extraction may be performed with black boxes at lower levels to locate at least some of the problems that may exist in top-level interconnect. Lower level blocks may also be run independently to locate at least some of the noise coupling problems that may exist in their interconnect.

SPICE Comparisons

The normalized noise levels (peak induced noise voltage as a fraction of Vdd) reported by the simulator of the present invention are compared to SPICE results on two types of circuits. Type 1 are comparisons on 'test circuits' where some assumptions made by the Noisetool of the present invention were constrained to be true. These comparisons are made on wires with coupling uniformly distributed, no branches, and two major, uniform, aggressors switching at the same time. These circuits give a value of peak noise voltage between 20% and 40% of Vdd, since this is a range where failures are likely to occur. Results for a 0.25 u technology are shown in Table 1.

TABLE 1

| | Peak Noise/Vdd | | |
|---|---|---|---|
| Signal Description | Noisetool | SPICE | Error |
| 1 mm long; minimum width and space to aggressors | 0.30 | 0.29 | 4% |
| 1 mm long; min width and space; very strongly held | 0.28 | 0.27 | 4% |
| 2 mm long; min width and space | 0.42 | 0.38 | 10% |
| 2 mm long; twice min width and space | 0.29 | 0.28 | 4% |
| 3 mm long; twice min width and space | 0.35 | 0.32 | 9% |
| 2 mm long; twice min width;1.5 × min space; strongly held | 0.36 | 0.33 | 9% |
| 3 mm long wire; partial shield; twice min width; min space | 0.29 | 0.27 | 7% |
| 2.5 mm long; twice min width; thrice min space | 0.27 | 0.24 | 12% |

TABLE 1-continued

| | Peak Noise/Vdd | | |
|---|---|---|---|
| Signal Description | Noisetool | SPICE | Error |
| 3 mm low resistive metal; min width and space | 0.26 | 0.28 | −7% |
| 4 mm low resistive metal; min width and space | 0.27 | 0.29 | −7% |

Type 2 comparisons are run on actual blocks taken from a large microprocessor design. The results for a regular datapath structure, a synthesized control block, and for the core of the chip are presented. Peak noise calculated on nets was found pessimistic by an average of 20%. In the floating point datapath, where wiring is regular and non-branching, the average error is lower than in a more random control block. The aggressor rise time, [Tr as defined previously], was found pessimistic by about 30% on average and 66% in the worst case, and is the largest contributor to inaccuracy in the peak noise. Improved calculations of the aggressor slew rate, especially for aggressors with non uniform loading and multiple branches, will enhance the accuracy of Noisetool.

TABLE 2

| Measure\Circuit | Floating Point Datapath | Top Level Chip | Instruction Issue Control |
|---|---|---|---|
| Worst case peak noise[a] | 155% | 155% | 140% |
| Number of violations[a] | 200% | 250% | 220% |
| Overlap in reported violations[b] | 100% | 99% | 100% |
| R.M.S. error in peak noise compared to SPICE | 12% | 24% | 20% |

[a]Number reported by Noisetool/Number reported by SPICE
[b]Percentage of nets reported by SPICE that were also reported by Noisetool

TABLE 3

| Measure\Circuit | Floating Point Datapath |
|---|---|
| Worst case peak noise[a] | 95% |
| Number of violations[a] | 99% |
| Overlap in reported violations[b] | 100% |
| R.M.S. error in peak noise of analysis of hierarchical gate-level netlist as compared to a flat netlist | 2% |

[a]Number reported by hierarchical analysis/Number reported by flat analysis
[b]Percentage of nets reported by flat analysis that were also reported in hierarchical analysis A computer software product is any machine-readable media having recorded on it a computer program, whether for distribution or storage.

Conclusion

While there have been described above the principles of the present invention with specific embodiments thereof, it is to be understood that the foregoing description is made by way of example and not as limitation to the scope of the invention. The foregoing disclosure may suggest other modifications to those persons skilled in the relevant art. Such modifications may involve other features which are already known per se and which may be used instead of or in addition to features already described herein. Although claims have been made in this application to particular combinations of features, it is understood that the scope of the disclosure herein also includes novel features or any novel combination of features disclosed explicitly or implicitly or any modification or generalization thereof which is apparent to persons skilled in the art, whether or not such relates to the invention as presently claimed in any claim and whether or not it mitigates any or all technical problems as confronted by the present invention. The applicants reserve the right to formulate new claims to such features and combinations of such features during the prosecution of the present application or of any further application derived therefrom.

What is claimed is:

1. An automated method of analyzing crosstalk in a digital logic integrated circuit, the method operational on a digital computer, comprising the steps of:

providing an extracted, parameterized, hierarchical, netlist from a layout of the integrated circuit, the netlist describing invocations of a plurality of members of the set of logic gates, gray-boxes, and black-boxes, a plurality of wires coupled to said invocations of members of the set of logic gates, gray-boxes, and black-boxes, and a plurality of coupling capacitances between wires of the plurality of wires;

providing a set of library models of logic gates, the library models comprising at least an output resistance and an input capacitance for at least some of the invocations of members of the set of logic gates, gray-boxes, and black-boxes;

determining a load capacitance of each of the plurality of wires, where the load capacitance of each wire incorporates the sum of input capacitances of each invocation in the netlist having a connection to the wire;

determining a driving resistance of each of the plurality of wires, where the driving resistance of wires driven by invocations of the netlist and found in the library is read from the library;

for at least one victim wire of the plurality of wires, determining a subset of the plurality of wires to be aggressor wires to the victim wire, the subset having at least one wire;

determining at least one risetime of the aggressor wires based upon factors including the load capacitance of the aggressor wire and the driving resistance of the aggressor wire;

calculating a height of a coupled noise on the victim wire induced by the aggressor wires, the height dependant upon factors including the risetime of the aggressor wires, the load capacitance of the victim wire, the coupling capacitance from the aggressor wires to the victim wire, and the driving resistance of the victim wire;

determining an alarm threshold for the victim wire based upon a type of a logic gate that receives the victim wire;

determining whether the height of a coupled noise on the victim wire exceeds the alarm threshold of the victim wire.

2. The automated method of analyzing crosstalk in a digital logic integrated circuit of claim 1, wherein the step of calculating a height of a coupled noise is performed through use of a model of coupling to the victim wire, the model incorporating a first resistance that represents an output resistance of a gate or block that drives the victim wire as read from a library model of said gate or block, a second resistance that represents a resistance of the victim wire, at least one capacitance that represents coupling from the aggressor wires to the victim wire, and at least one capacitance that represents capacitance between the victim wire and circuit elements other than the aggressor wires.

3. The automated method of analyzing crosstalk in a digital logic integrated circuit of claim 1 wherein the step of determining an alarm threshold for the victim wire based upon a type of a logic gate that receives the victim wire is performed by reading an alarm threshold from a library gate model.

4. A computer software product comprising:

computer readable code for reading an extracted, parameterized netlist from a layout of an integrated circuit, the netlist comprising a plurality of circuit elements selected from the set consisting of logic gates, blocks, and transistors, a plurality of wires coupled to the circuit elements, a plurality of load capacitances on the plurality of wires, and a plurality of coupling capacitances between wires of the plurality of wires;

for at least one victim wire of the plurality of wires, computer readable code for determining a subset of the plurality of wires to be aggressor wires to the victim wire, the subset having at least one wire;

computer readable code for determining at least one risetime of the aggressor wires;

computer readable code for calculating a height of a coupled noise on the victim wire induced by the aggressor wires, the height dependant upon the risetime of the aggressor wires;

computer readable code for determining an alarm threshold for the victim wire based upon a type of a logic gate that receives the victim wire;

computer readable code for determining whether the height of a coupled noise on the victim wire exceeds the alarm threshold of the victim wire; and computer readable code for outputting a file in machine readable form having a list of victim wires for which the height of a coupled noise exceeds the alarm threshold of the victim wire.

5. The computer software product of claim 4 wherein the computer readable code for determining an alarm threshold for the victim wire based upon a type of a logic gate that receives the victim wire operates by reading an alarm threshold from a library gate model.

6. The computer software product of claim 4 wherein the computer readable code for determining an alarm threshold for the victim wire based upon a type of a logic gate that receives the victim wire operates by setting a default threshold if no suitable library gate model is present.

7. The computer software product of claim 4 wherein if the aggressor wires are driven by a gate, the computer readable code for determining at least one risetime of the aggressor wires determines the risetime based upon a driving output resistance of a library model of the gate.

8. A computer software product comprising:

computer readable code for reading an extracted and parameterized netlist from a layout of an integrated circuit, the netlist comprising invocations of a plurality of circuit elements selected from the set consisting of logic gates, blocks, and transistors, descriptions of a plurality of wires interconnecting the plurality of circuit elements, descriptions of a plurality of load capacitances of the plurality of wires, and descriptions of a plurality of coupling capacitances between wires of the plurality of wires;

computer readable code for reading a library model associated with at least one circuit element of the plurality of circuit elements of the netlist;

for at least one victim wire of the plurality of wires, computer readable code for determining a subset of the plurality of wires to be aggressor wires to the victim wire, the subset having at least one wire;

computer readable code for merging the aggressor wires into an effective lumped aggressor associated with the victim wire, and for determining an effective risetime of the common aggressor based upon at least one driving resistance of a circuit element that drives at least one of the aggressor wires, the effective resistance being determined from the library model associated with each of the at least one circuit elements that drive the aggressor wires;

computer readable code for calculating a height of a coupled noise on the victim wire induced by the aggressor wires, the height dependant upon factors comprising the risetime of the common aggressor, coupling capacitances of the common aggressor to the victim wire, load capacitances of the victim wire, and an output resistance of a circuit element described by the netlist as driving the victim wire;

computer readable code for determining an alarm threshold for the victim wire based upon a type of a logic gate that receives the victim wire;

computer readable code for determining whether the height of a coupled noise on the victim wire exceeds the alarm threshold of the victim wire; and computer readable code for outputting a file in machine readable form having a list of victim wires for which the height of a coupled noise exceeds the alarm threshold of the victim wire.

9. The computer software product of claim 8, wherein there is a black-box library model associated with at least one black-box of the netlist, wherein the black-box library model includes an output resistance of the black-box, and wherein the output resistance of the black box is used by the computer readable code of the software product in calculating the height of a coupled noise on a victim wire driven by the black box.

* * * * *